United States Patent
Sidorova et al.

(10) Patent No.: US 7,223,442 B2
(45) Date of Patent: May 29, 2007

(54) METHOD FOR PRODUCING A CONDUCTING DOPED DIAMOND-LIKE NANOCOMPOSITE FILM AND A CONDUCTING DOPED DIAMOND-LIKE NANOCOMPOSITE FILM

(75) Inventors: Ljudmila Petrovna Sidorova, Moscow (RU); Vitaly Konstantinovich Dmitriev, Moscow (RU); Vitaly Nikolaevich Inkin, Moscow (RU)

(73) Assignee: International Technology Exchange, Inc., Tulson, AR (US)

( * ) Notice: Subject to any disclaimer, the term of this patent is extended or adjusted under 35 U.S.C. 154(b) by 870 days.

(21) Appl. No.: 10/208,801

(22) Filed: Aug. 1, 2002

(65) Prior Publication Data

US 2004/0023032 A1    Feb. 5, 2004

(51) Int. Cl.
  *C23C 16/26* (2006.01)
(52) U.S. Cl. ............... 427/249.7; 427/248.1; 427/249.1; 427/331; 427/372.2; 427/379
(58) Field of Classification Search ............ 427/249.1, 427/249.7, 248.1, 577, 578, 530, 532, 545, 427/546, 587, 593, 579; 204/192.17
  See application file for complete search history.

(56) References Cited

U.S. PATENT DOCUMENTS 5,182,093 A * 1/1993 Cann ...................... 423/446
5,352,493 A * 10/1994 Dorfman et al. ............ 427/530
5,385,762 A * 1/1995 Prins ....................... 427/526
5,981,000 A * 11/1999 Grill et al. ................ 427/577

* cited by examiner

*Primary Examiner*—Timothy Meeks
*Assistant Examiner*—Howard Abramowitz

(57) ABSTRACT

The present invention provides a method for producing a conducting doped diamond-like nanocomposite film containing, as basic elements, carbon, silicon, metal, oxygen and hydrogen. The film is produced as follows: a substrate is disposed in a vacuum chamber, and a voltage of 0.3-5.0 kV is applied to the substrate; a gas discharge plasma with an energy density of more than 5 kilowatt-hour/gram-atom of carbon particles is generated, and an organosiloxane compound is evaporated into the plasma; a beam of particles of a dopant is introduced into the plasma; and a film is grown on the substrate to produce a conducting doped carbon nanocomposite film with a predetermined relationship of atomic concentrations of carbon, metal and silicon. The film surface is coated with a silicon dioxide layer. A unidirectional alternating current is passed through the film in a current generator mode to effect electric thermal exposure of the film. As the result, a conducting doped diamond-like nanocomposite film having a multilayer structure is produced.

7 Claims, 3 Drawing Sheets

METHOD FOR PRODUCING A CONDUCTING DOPED DIAMOND-LIKE NANOCOMPOSITE FILM AND A CONDUCTING DOPED DIAMOND-LIKE NANOCOMPOSITE FILM

RELATED APPLICATION

This application is related to PCT Patent Application No. PCT/RU01/00058, filed 8 Feb. 2001, the disclosure of which is incorporated by reference in its entirety for all purposes.

TECHNICAL FIELD

The present invention relates to microelectronics and more specifically to a method for producing a conducting doped diamond-like nanocomposite film and to such a conducting doped diamond-like nanocomposite film.

The films are applicable in microelectronics as resistors, which emit infrared light when heated by a current, and can be used in spectroscopic instruments, gas detectors and thermal printers.

BACKGROUND

A method for producing a conducting metal-containing diamond-like nanocomposite film containing, as basic elements, carbon, silicon, metal, oxygen and hydrogen, and disposed on a dielectric substrate is known from U.S. Pat. No. 5,352,493. The method for producing the film is the following: A holder with a substrate of a dielectric material is placed in a vacuum chamber. A voltage of 0.3-5.0 kV with a frequency within the range of 1-25 MHz is applied to the substrate holder, and the substrate is maintained at a temperature of no more than 200-500° C. A gas discharge plasma with an energy density over 5 kilowatt-hour/gram-atom of carbon particles is generated in the vacuum chamber. Organosiloxane heated to a temperature of 500-800° C. is evaporated into the plasma to serve, while being decomposed in the plasma, as a source of carbon, silicon, oxygen and hydrogen. A beam of particles of a dopant in the form of atoms or ions is introduced into the vacuum chamber along with the plasma. A pressure of no more than $3\times10^{-4}$ torr is maintained in the vacuum chamber, and atoms or ions of carbon, silicon, oxygen and hydrogen, as well as atoms or ions of the dopant are deposited on the substrate.

The resulting film is an amorphous isotropic structure consisting of three networks: a basic network diamond-like carbon network where the atomic concentration of carbon in the film is 40% of the total atomic concentration of the elements; a second network of an oxygen-stabilized silicon network, effectively glassy silicon; a third network of metal atoms filling the nanopores in the system of the two other networks, where the atomic concentration of the metal atoms is 20-25% of the total atomic concentration of elements. The third network determines the conductivity of the film. Since the film is formed at low temperatures of 200-500° C., all three networks: the carbon network, the amorphous silicon network and the amorphous metal network, are coupled to each other by weak chemical links, and the film microstructure is in a metastable state. It is claimed that the film exhibits a high degree of stability at elevated temperatures as high as 1250° C. This compares with crystalline diamond, which exhibits stability to heat up to 1100° C. It is claimed that the key to such properties lies in the absence of clusters and planar formations larger than 10 Å in the film structure, enabling the structure to stay in the metastable state at high temperatures. It is also claimed that clusters break the local symmetry in the structure and act as degradation centers.

This conventional method for producing a metal-doped diamond-like nanocomposite film has significant deficiencies. Contrary to the claims in U.S. Pat. No. 5,352,493, recent detailed investigations have revealed that the structure of the highly doped film produced by the above method exhibits nanoclusters of a size in the range of 30-500 Å, which are revealed by investigations with a scanning tunneling microscope. Apparently due to the film porosity, which appears in this case under high temperature conditions in the presence of oxygen atmosphere, an increased diffusion of oxygen into the film takes place, accompanied by carbon burn-out at high temperatures. Moreover, the clustering of the film results in instability of the metastable nanostructure with weak chemical links when the film is heated in use to higher temperatures. For the aforementioned reasons, instability of the film microstructure is already seen at a temperature of about 600° C., and this is accompanied by a temperature and time instability of electrical resistance of the film. The produced films exhibit a high electrical resistance exceeding the values mentioned in the description to the patent, apparently due barrier resistances at interfaces between the clusters.

Furthermore, the diamond-like properties of the film are related to atomic concentration of carbon at a level of 40% of the total atomic concentration of the elemental composition. The method for producing the film does not guarantee, due to its complexity, one-to-one reproduction of atomic concentrations of the elements contained in the film. Reduction in the carbon concentration leads to loss of the diamond-like properties and decreases the percent yield of films with diamond-like properties of the total quantity of the produced films.

The diamond-like films produced by the above method and having an atomic concentration of carbon of about 40% and an atomic concentration of metal of 20-25% exhibit insufficient plasticity, leading to destruction of the film-substrate system at high temperatures if a film having a thickness from fractions of a micron to a micron is produced on a thin substrate having a micron-sized thickness. Such service conditions of the film appear e.g., when the film is used as a resistive impedance heated by a current.

The aforementioned deficiencies of the conducting doped diamond-like nanocomposite films restrict the range of their application in practice.

The closest prior art is a method for producing a conducting doped diamond-like nanocomposite film containing, as basic elements, carbon, silicon, metal, oxygen and hydrogen, including the steps of: disposing a holder with a substrate of a dielectric material in a vacuum chamber; applying a voltage of 0.3-5.0 kV with a frequency within the range from 1 to 25 MHz to the substrate holder and maintaining a temperature of the substrate within the range from 200 to 500° C.; generating, in the vacuum chamber, a gas discharge plasma with an energy density of more than 5 kilowatt-hour/gram-atom of carbon particles; evaporating into the generated gas discharge plasma an organosiloxane compound heated to a temperature of 500-800° C. to serve as a source of carbon, silicon, oxygen and hydrogen while being decomposed in the plasma; introducing a beam of particles of a dopant in the form of atoms or ions into the vacuum chamber with the gas discharge plasma; depositing atoms or ions of carbon, silicon, oxygen and hydrogen, as well as atoms or ions of the dopant on the substrate to obtain a conducting doped carbon nanocomposite film as described in Russian patent No.2118206 (1998).

The method is aimed at production of films having a uniform composition throughout the volume. The result is attained by maintaining a pressure of no more than $1\times10^{-4}$ torr in the vacuum chamber before initiating the process of depositing the film. The voltage is subsequently applied to the substrate holder, and a ceramic leak valve through which an organosiloxane compound is supplied into the vacuum chamber is heated to a temperature of 500-800° C., and argon is supplied into the chamber until the plasma reaches a steady-state combustion. After holding during 5-10 min to establish thereby a stationary deposition process, the substrate is isolated from the plasma flow, and the pressure of argon in the chamber is raised to $2\times10^{-3}$ torr. Then the organosiloxane compound delivery is started and a source of dopant particles is enabled at the same time, and after expiration of 3-4 minutes the substrate is no longer isolated in order to provide growth of the film on the substrate. The dopants are not restricted to metals, but may also be nonmetals, chemical compounds, etc. Selection of the dopant is dictated by predetermined properties of the films to be produced.

A deficiency of the closest prior art method is that, like the preceding conventional method, the produced films consist of nanoclusters and exhibit a metastable microstructure with weak chemical links. As the result, instability of the film microstructure is already seen at a temperature of about 600° C., leading to a temperature and time instability of electrical resistance of the film at elevated temperatures, thereby impairing the film resistance at high temperatures and with thermal cycling.

The aforementioned deficiencies of the prior art method for producing doped diamond-like films restrict the range of practical application.

SUMMARY OF THE INVENTION

The object of the present invention is to provide a method to produce a doped diamond-like nanocomposite film which exhibits a thermally stable nanostructure, high electrical conductivity combined with stability at high temperatures, mechanical strength under thermal cycling, and stable electrical properties.

Another object of the invention is to provide a doped diamond-like nanocomposite film which exhibits a thermally stable nanostructure, high electrical conductivity combined with stability at high temperatures, mechanical strength under thermal cycling, and stable electrical properties.

According to an aspect of the invention, there is provided a method for producing a conducting doped diamond-like nanocomposite film containing, as basic elements, carbon, silicon, metal, oxygen and hydrogen, comprising the steps of: disposing a holder with a substrate of a dielectric material in a vacuum chamber; applying a voltage of 0.3-5.0 kV with a frequency within the range from 1 to 25 MHz to the substrate holder, and maintaining a temperature of the substrate within the range from 200 to 500° C.; generating, in the vacuum chamber, a gas discharge plasma with an energy density of more than 5 kilowatt-hour/gram-atom of carbon particles; evaporating into the generated gas discharge plasma an organosiloxane compound heated to a temperature of 500-800° C. to serve as a source of carbon, silicon, oxygen and hydrogen while being decomposed in the plasma; introducing a beam of particles of a dopant in the form of atoms or ions into the vacuum chamber with the gas discharge plasma; depositing atoms or ions of carbon, silicon, oxygen and hydrogen, as well as atoms or ions of the dopant on the substrate to produce a conducting doped carbon nanocomposite film.

In another feature of the invention, the above steps are successively applied to produce a plurality of conducting doped carbon nanocomposite films.

Another feature of the invention is to dispose two electrodes on each of the films, electrically couple the electrodes to the film, coat the surface of the film with a layer of silicon dioxide, connect the electrodes to an ac source, and subject the film to electrical thermal exposure (ETE) by passing a unidirectional alternating current through the film to thermally anneal the film.

Diamond-like nanocomposite materials have a wide range of applications as thermoresistive films, infrared light emitting films and protective coatings. The high degree of thermal stability resulting from the present invention opens the possibility to produce infrared light of high intensity.

BRIEF DESCRIPTION OF THE DRAWINGS

The main features of the invention will become apparent upon examination of the accompanying drawings wherein.

DETAILED DESCRIPTION OF THE INVENTION

The new class of doped diamond-like nanocomposites of the invention has an amorphous anisotropic layered structure which exhibits a high degree of thermal stability, high electrical conductivity combined with heat resistance, mechanical strength at thermal cycling, and stable electrical properties. The diamond-like nanocomposites contain, as basic elements, carbon, silicon, oxygen and hydrogen and metal as a dopant.

The conducting doped diamond-like nanocomposite film is produced in the following manner: A holder with a substrate of a dielectric material, having a thickness in the range from 1 to 10 microns is disposed in a vacuum chamber. A voltage of 0.3-5.0 kV with a frequency within the range from 1 to 25 MHz is applied to the substrate holder, and the temperature of the substrate is maintained within the range from 200 to 500° C. A gas discharge plasma with an energy density greater than 5 kilowatt-hour/gramatom of carbon particles is generated in the vacuum chamber. An organosiloxane compound is heated to a temperature of 500-800° C. is evaporated into the generated gas discharge plasma to serve, while being decomposed in the plasma, as a source of carbon, silicon, oxygen and hydrogen. Then, a beam of particles of a dopant in the form of atoms or ions is introduced into the vacuum chamber with the gas discharge plasma. Atoms or ions of carbon, silicon, oxygen and hydrogen, as well as atoms or ions of the dopant are deposited on the substrate to produce a conducting doped carbon nanocomposite film.

The aforementioned steps are successively performed to obtain a plurality of conducting doped carbon nanocomposite films on top of each other. The films have an atomic concentration of carbon within the range from about 25% to about 39% of the total atomic concentration of the elements, an atomic concentration of the metal from about 20% to about 35% of the total atomic concentration of the elements, and a combined atomic concentration of carbon, silicon and the metal from about 85% to about 90% of the total atomic concentration of the elements.

Two electrodes for thermally annealing the film, by passing current through the film, are disposed on the film by sputtering metal on predetermined regions on the film. The film surface is coated with a layer of silicon dioxide by deposition of silicon dioxide either by pyrolytic growth, or by magnetron sputtering.

Figure 1:
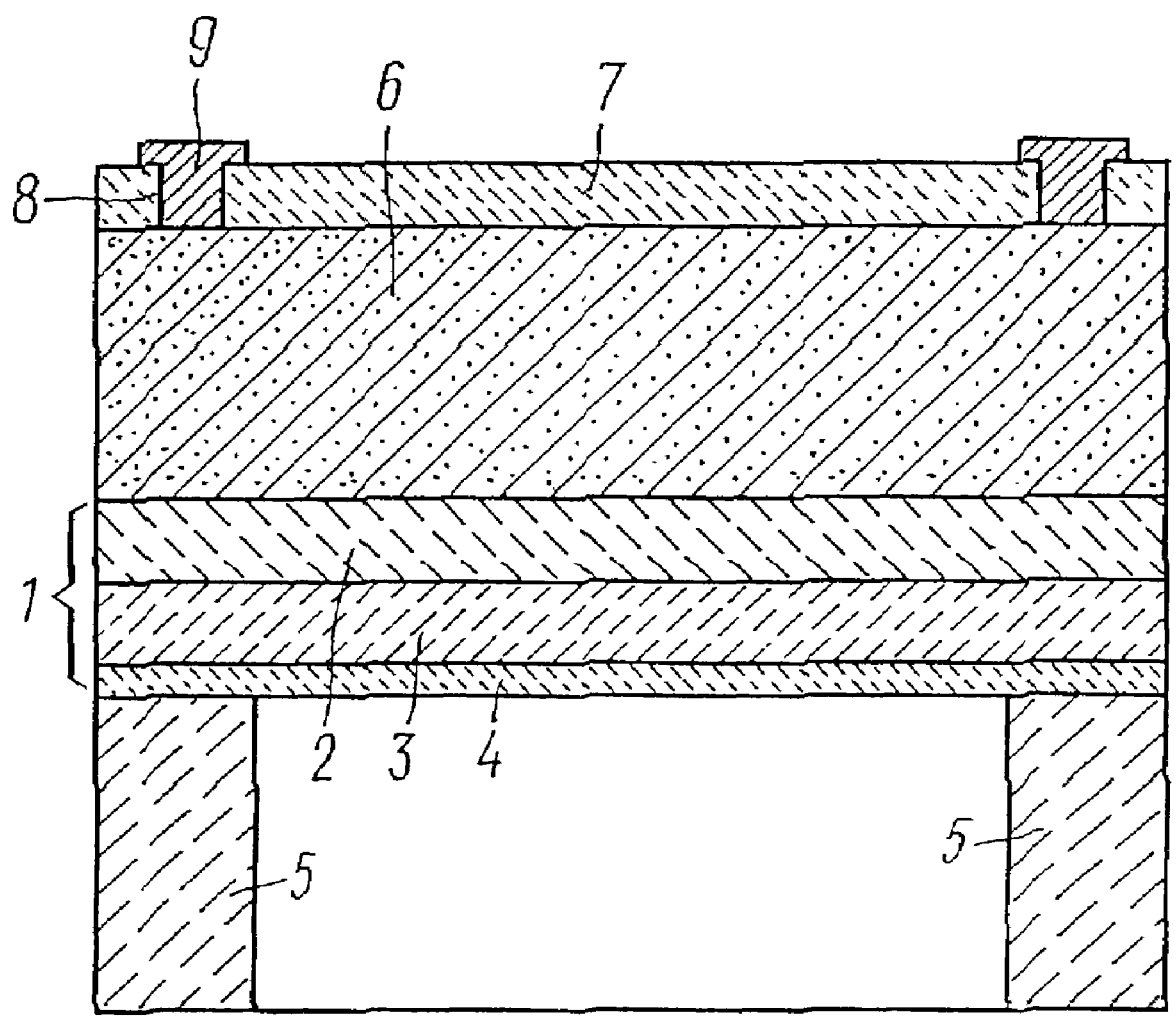
FIG. 1 shows a conducting doped carbon nanocomposite film in accordance with the invention.

FIG. 1 shows a selected conducting doped carbon nanocomposite film comprising a substrate 1 including a silicon nitride layer 2, a silicon dioxide layer 3 and a boron-doped silicon layer 4. The substrate 1 is arranged on a silicon frame 5. Disposed on a substrate 1 is a layer 6 of a doped carbon nanocomposite material with a silicon dioxide layer 7 disposed thereon. Electrodes 9 are accommodated in holes 8 provided in the layer 7.

Figure 2:
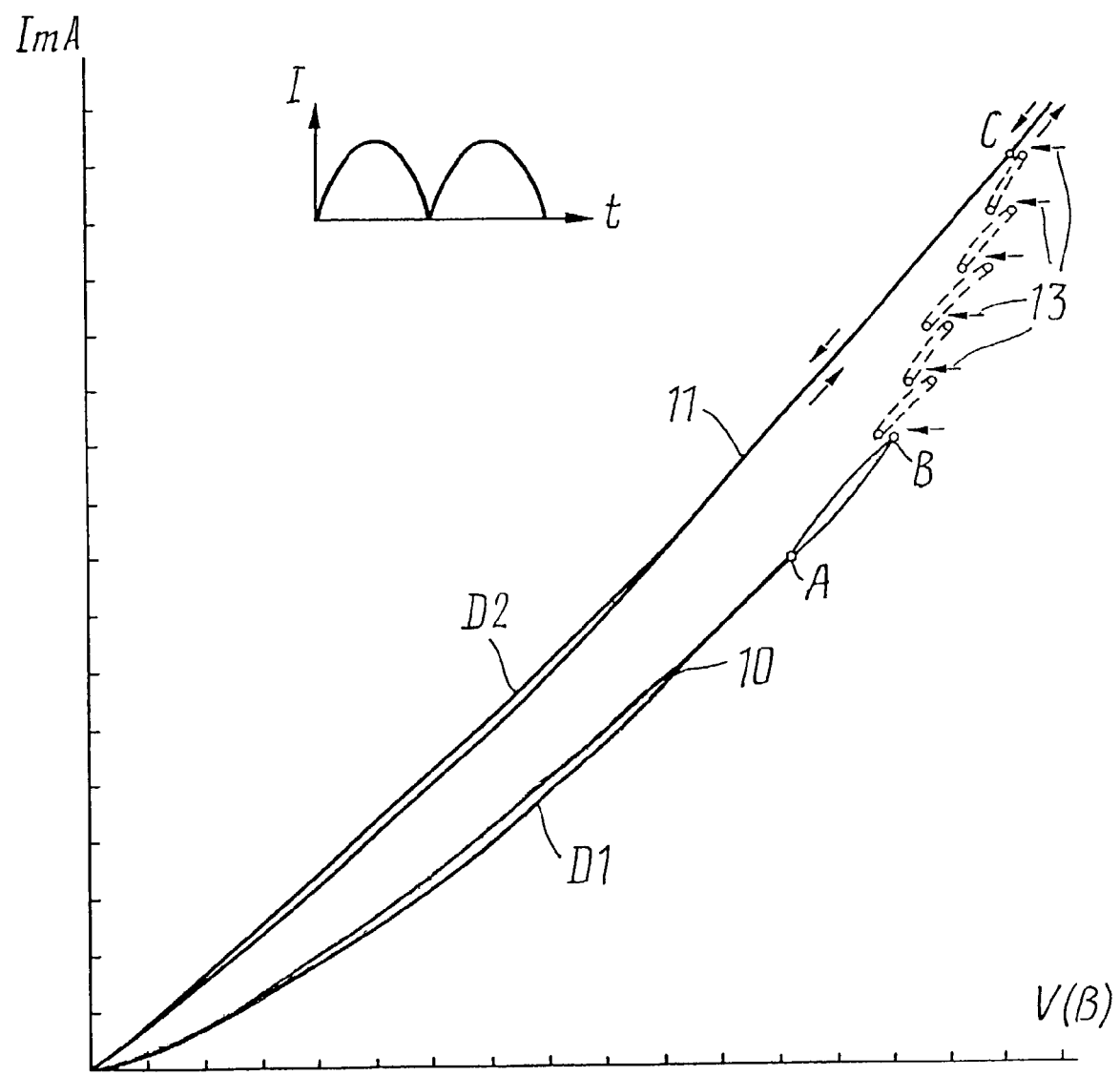
FIG. 2 shows current-voltage curves of a doped carbon nanocomposite film and a doped diamond-like nanocomposite film in accordance with the invention.

The electrodes 9 are connected to an alternating current (ac) source (not shown). The film is subjected to electric thermal exposure (ETE). To this end, a unidirectional alternating current is passed through the film in a current generator mode in the form of continuous pulses with flat leading and trailing edges and a duration from 5 to 100 ms. The current-voltage curve (CVC) in FIG. 2 (line 10) before point "A" has hysteresis D1 in the minimum current region and no hysteresis in the maximum current region. This is the CVC of the conducting doped carbon nanocomposite film. Hysteresis appears with insignificant increase in the current amplitude value from point "A" to point "B". The current amplitude value at point "B" will be minimal, whereupon a gradual increase in the amplitude is required.

When passing the unidirectional alternating current in a current generator mode in the form of a series of continuous pulses, the pulse duration is set according to the thickness of the film and the substrate.

The current amplitude is increased from the minimum value with a rate at which an explicit hysteresis loop is absent within the entire range of current amplitude variations in the maximum current region.

The current pulse amplitude is gradually increased. The temperature of the film is brought to about 800-1050° C. in conditions of fluctuated temperature and internal mechanical stresses.

Once the above temperature has been reached, the current pulse amplitude is maintained constant, and the film is held under these conditions for several minutes, whereupon the current is cut off (point "C" on the CVC).

Line 11 represents a CVC of a conducting doped diamond-like nanocomposite film, it has hysteresis D2 in the minimum current region, and the curve can be scanned repeatedly without change.

The current amplitude is increased in a stepped fashion (FIG. 2), wherein a minimum current value from which the stepped mode is maintained, from point "B" to point "C", is determined by appearance of a hysteresis loop in the maximum current region on the CVC, a particular hysteresis loop corresponding to each of the steps. Each time the current amplitude is held at a constant value until the hysteresis is minimized, whereupon the amplitude is increased until a new explicit enhancement of hysteresis appears in the maximum current region. Arrows 13 show how the points corresponding to constant current amplitude values move along the horizontal voltage axis in the process of holding the current constant.

The maximum permissible current amplitude value of the ETE is determined by appearance of a hysteresis loop in the maximum current region on the CVC and retention of the hysteresis loop when current amplitude value is maintained constant.

The resulting conducting doped diamond-like nanocomposite film has a multilayer structure (FIG. 3), in which the atomic concentration of the metal in the direction from silicon dioxide to the substrate varies periodically and gradually relative to the average atomic concentration value of the metal over the film thickness, and this variation is in opposite phase to the variation of atomic concentrations of C and Si in the same direction from silicon dioxide to the substrate and with the same period, and an intermediate metallide nanolayer of Me and Si atoms is formed at the interface between the silicon dioxide layer and the film.

Figure 3:
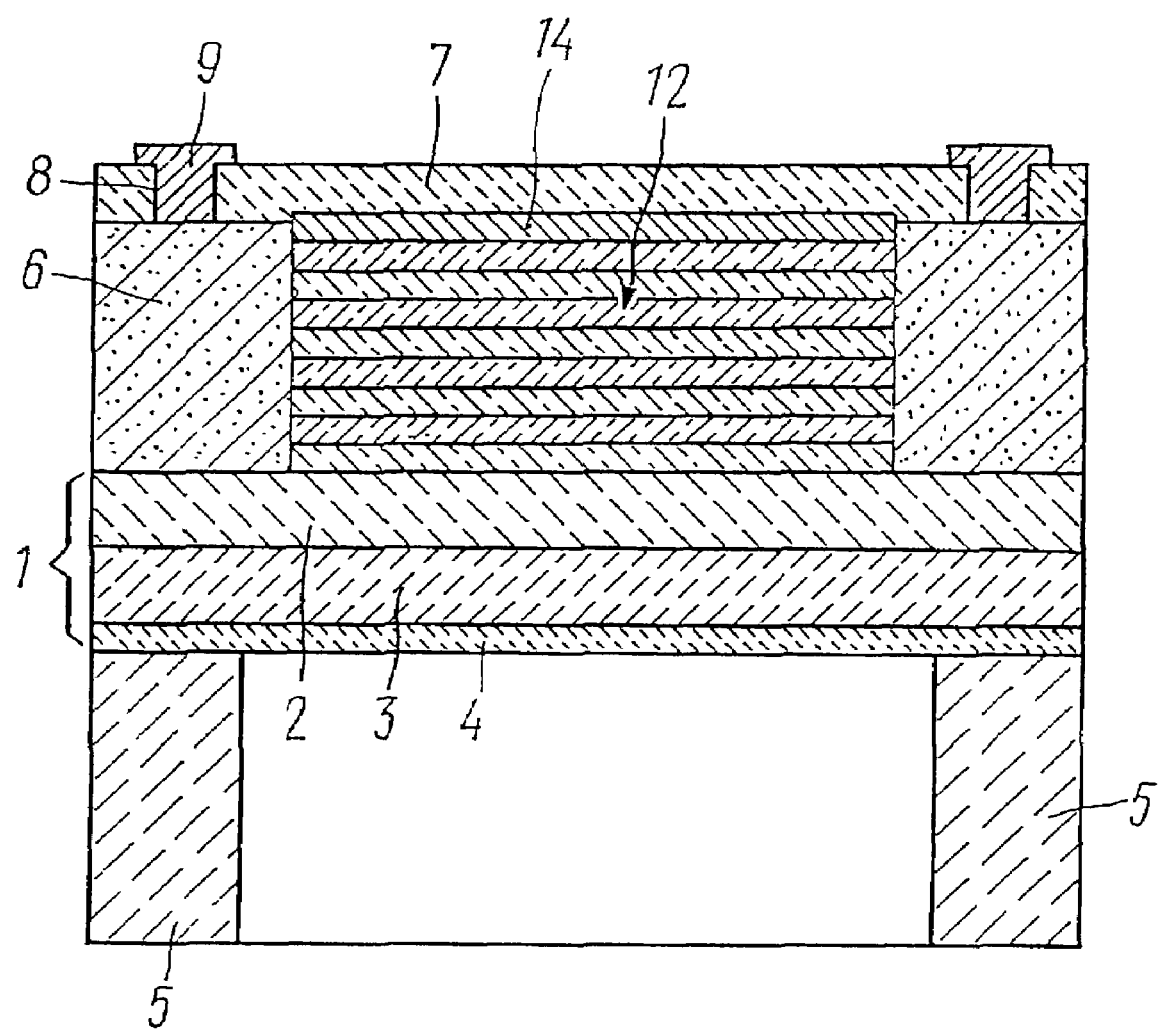
FIG. 3 shows a conducting doped diamond-like nanocomposite film, in accordance with the invention.

FIG. 3 shows a conducting doped diamond-like nanocomposite film comprising a layer 12 of a diamond-like nanocomposite material. The conducting doped diamond-like nanocomposite film containing, as basic elements, carbon, silicon, metal, oxygen and hydrogen, comprises a substrate 1 of a dielectric material, having a thickness within the range from 1 to 10 microns, with a layer 12 of a conducting doped diamond-like material disposed thereon. A silicon dioxide layer 7 is disposed on the film surface. An intermediate metallide nanolayer 14 comprising Me and Si atoms is located between the silicon dioxide layer 7 and the layer 12 of a conducting doped diamond-like material to prevent diffusion of oxygen.

The layer 12 of a conducting doped diamond-like material has a multilayer structure in which the atomic concentration of the metal in the direction from silicon dioxide to the substrate varies periodically and gradually relative to the average atomic concentration value of the metal over the film thickness, and this variation is in opposite phase to the variation of atomic concentrations of C and Si in the same direction from silicon dioxide to the substrate and with the same period.

The invention claimed is:

1. A method for producing a conducting doped diamond-like nanocomposite film containing, as basic elements, carbon, silicon, metal, oxygen and hydrogen, comprising the steps of:

disposing a holder with a substrate of a dielectric material in a vacuum chamber, the substrate having a thickness within the range from 1 to 10 microns;

applying a voltage of 0.3-5.0 kV with a frequency within the range from 1 to 25 MHz to the substrate holder, and maintaining a temperature of the substrate within the range from 200 to 500° C.;

generating, in the vacuum chamber, a gas discharge plasma with an energy density of more than 5 kilowatt-hour/gram-atom of carbon particles;

evaporating, into the generated gas discharge plasma, an organosiloxane compound heated to a temperature of 500-800° C. to serve as a source of carbon, silicon, oxygen and hydrogen while being decomposed in the plasma;

introducing a beam of particles of a dopant in the form of atoms or ions into the vacuum chamber with the gas discharge plasma;

depositing atoms or ions of carbon, silicon, oxygen and hydrogen, as well as atoms or ions of the dopant on the substrate to produce a conducting doped carbon nanocomposite film, the method is characterized by:

successively effecting the above steps to produce a plurality of conducting doped carbon nanocomposite films having an atomic concentration of carbon within the range from about 25% to about 39% of the total atomic concentration of the elements, an atomic concentration of the metal from about 20% to about 35% of the total atomic concentration of the elements, and a combined atomic concentration of carbon, silicon and the metal from about 85% to about 90% of the total atomic concentration of the elements;

disposing two electrodes on the films, and electrically coupling the electrodes to the film;

coating the surface of the film with a layer of silicon dioxide;

connecting the electrodes to an ac source;

subjecting the film to electric thermal exposure by passing a unidirectional alternating current through the film in a current generator mode in the form of continuous pulses with flat leading and trailing edges and a duration from 5 to 100 ms, the current having a minimum amplitude value which is defined by appearance of hysteresis loop on a current-voltage curve in a region close to maximum current values;

gradually increasing the current pulse amplitude and bringing the film to a temperature of about 800-1050° C. in conditions of fluctuated temperature and internal mechanical stresses;

upon reaching said temperature, maintaining the current pulse amplitude constant and holding the film under these conditions for several minutes whereupon the current is cut off;

producing thereby a conducting doped diamond-like nanocomposite film having a multilayer structure in which the atomic concentration of the metal varies in the direction from silicon dioxide to the substrate periodically and gradually relative to the average value of the atomic concentration of the metal over the film thickness, the variation being in opposite phase to variation of atomic concentrations of C and Si in the same direction from silicon dioxide to the substrate and with the same period, and forming an intermediate metallide nanolayer of metal and Si atoms at the interface between the silicon dioxide layer and the film.

2. The method of claim 1, characterized in that said disposing of two electrodes on the film and electrically coupling of the electrodes to the film is effected by sputtering metal on predetermined regions on the film and forming thereby conducting areas.

3. The method of claim 1, characterized in that said coating of the surface of the film with a layer of silicon dioxide is effected by pyrolytic growth or magnetron sputtering of silicon dioxide.

4. The method of claim 1, characterized in that when passing a unidirectional alternating current through the film in a current generator mode in the form of a series of continuous pulses, a pulse duration is set according to a thickness of the film and the substrate.

5. The method of claim 1, characterized in that the current amplitude is varied at a rate providing the absence of an explicit hysteresis loop in the maximum current region within the entire range of the current amplitude variation.

6. The method of claim 1, characterized in that the increasing of the pulse current amplitude is effected in a stepped mode, a minimum current value from which the stepped mode is maintained being determined by appearance of a hysteresis loop in the maximum current region on the current-voltage curve, each time holding of the current amplitude value is effected until the hysteresis is minimized, whereupon the amplitude is increased until a new explicit enhancement in the hysteresis appears in the maximum current region.

7. The method of claim 4, characterized in that a maximum permissible value of the electric thermal exposure current amplitude is defined by appearance of a hysteresis loop in the maximum current region on the current-voltage curve and retention of the shape of the hysteresis loop while the achieved current amplitude value is maintained.

* * * * *